(12) United States Patent
Fujita et al.

(10) Patent No.: US 7,214,624 B2
(45) Date of Patent: May 8, 2007

(54) RESIST PATTERN FORMING METHOD, MAGNETIC RECORDING MEDIUM MANUFACTURING METHOD AND MAGNETIC HEAD MANUFACTURING METHOD

(75) Inventors: Minoru Fujita, Tokyo (JP); Mitsuru Takai, Tokyo (JP)

(73) Assignee: TDK Corporation, Tokyo (JP)

( * ) Notice: Subject to any disclaimer, the term of this patent is extended or adjusted under 35 U.S.C. 154(b) by 212 days.

(21) Appl. No.: 10/982,824

(22) Filed: Nov. 8, 2004

(65) Prior Publication Data
US 2005/0118817 A1 Jun. 2, 2005

(30) Foreign Application Priority Data
Nov. 14, 2003 (JP) ............ P2003-384694

(51) Int. Cl.
*H01L 21/302* (2006.01)
(52) U.S. Cl. ............ 438/706; 438/725
(58) Field of Classification Search ........ 438/706, 438/710, 714, 723, 725
See application file for complete search history.

(56) References Cited
U.S. PATENT DOCUMENTS
5,772,905 A * 6/1998 Chou ............ 216/44

6,309,580 B1 * 10/2001 Chou ............ 264/338
6,814,897 B2 * 11/2004 Morita ............ 264/1.33
6,929,762 B2 * 8/2005 Rubin ............ 264/40.1
2004/0091748 A1 * 5/2004 Kamata et al. ...... 428/694 T
2004/0211755 A1 * 10/2004 Yusa et al. ............ 216/54
2005/0146079 A1 * 7/2005 Chou ............ 264/319
2005/0164494 A1 * 7/2005 Nakagawa et al. ...... 438/637

FOREIGN PATENT DOCUMENTS
JP   10-351605   6/2000
JP   2001-026256   8/2002

* cited by examiner

*Primary Examiner*—Kin-Chan Chen
(74) *Attorney, Agent, or Firm*—Kenyon & Kenyon LLP

(57) ABSTRACT

A mold having a pattern of a concavo-convex surface including protrusion and recess is prepared and the pattern is transferred to a resist layer formed on a substrate by an imprinting method. The side surface of a protrusion of the transferred resist pattern is then etched so that the protrusion has a width narrower than a width of the corresponding recess formed to the mold. This resist pattern forming method is preferably applicable to a magnetic recording medium manufacturing method and a magnetic head manufacturing method.

6 Claims, 8 Drawing Sheets

RESIST PATTERN FORMING METHOD, MAGNETIC RECORDING MEDIUM MANUFACTURING METHOD AND MAGNETIC HEAD MANUFACTURING METHOD

BACKGROUND OF THE INVENTION

1. Field of the Invention

The present invention relates to a resist pattern forming (formation) method utilizing an imprinting method, and also relates to a magnetic recording medium manufacturing method and a magnetic head manufacturing method, both utilizing the method of forming the resist pattern mentioned above.

2. Related Art

In a method of manufacturing a semiconductor element or recording medium, for example, there is known an optical lithography method for forming a fine resist pattern to a resist layer formed on a substrate surface. In the resist pattern forming method utilizing this optical lithography method, a light is irradiated on the resist layer formed on the substrate surface (for example, a layer formed by applying a resist material, in thin film form, such as a resin which is reacted with light to be hardened) to thereby form a concavo-convex pattern, on the resist layer, which is thereafter developed, thus forming the resist pattern.

Furthermore, in recent years, in order to satisfy requirement of high density of the semiconductor element and increasing of recording capacity of the recording medium, there has been developed an electron-beam lithography technology capable of forming a resist pattern of nano-meter size by irradiating an electron beam in place of the light.

In such electron beam lithography technology, however, the resist pattern formation requires much time, which may provide inconvenience for mass-production, and moreover, an electron-beam lithograph device is expensive, leading to cost-up of a product.

Furthermore, in these days, another resist pattern forming method has been proposed as fine resist pattern forming method (as 'imprinting method'), for example, as disclosed in "Imprint of sub-25 nm vias and trenches in polymers" (Applied Physics Letters), by Stephen Y. Chou, Nov. 20, 1995, Vol. 67, No. 21, Pages 3114–3116, in which a concavo-convex portion including protrusion and recess of a nano-meter size formed to a mold is pressed against the substrate surface to thereby transfer the shape of such concavo-convex portion to thereby form the resist pattern of nano-meter size.

This resist pattern forming method includes the following steps or processes, for example, such as shown in FIGS. 12A to 12D.

With reference to these figures, a mold (which may be called 'stamper') 21, as shown in FIG. 12B, having inverted patterns having protrusion 22 and recess 23 to be transferred of a concavo-convex shape and a substrate 11 are heated to a temperature more than a transition temperature of glass of a resist material forming the resist layer 12 and, thereafter, such mold 21 is pressed against the resist layer 12 formed on the surface of the substrate 11 as shown in FIG. 12A.

Next, under the state that the mold 21 is pressed against the resist layer 12, it is cooled to a temperature less than the transition temperature of the glass used as the resist material and then separated from the resist layer 12, whereby, as shown in FIG. 12C, the concavo-convex pattern (including protrusion 15 and recess 14) is transferred to the resist layer 12.

Further, in such processes, a resist material, which is not removed to the other portions at the mold pressing time, remains in the recess 14 of the resist pattern formed on the substrate 11, which is called herein later as 'resist remaining layer' denoted by reference numeral '3'. For this reason, as shown in FIG. 12D, this resist remaining layer 3 is thereafter removed by, for example, an etching treatment, to thereby expose a substrate surface 16 at this recess 14.

Further, although not directly relating to such imprint method, prior art of, for example, Japanese Patent Laid-open (KOKAI) Publication No. 2000-181082 or No. 2003-231608 discloses a patterning technology as 'semiconductor manufacturing method' in which a photoresist (or photoresist) subjected to pattern exposure is treated by isotopic-etching using ozone to thereby carry out a fine patterning more than that performed by the pattern exposure.

In consideration of countermeasure to the requirement for achieving the high density of the semiconductor element and increasing the recording capacity of the recording medium, in order to make the recording density of the recording medium high, at the time of manufacturing a discrete-track-type magnetic recording medium (called hereunder 'discrete track medium'), which has been attracted as magnetic recording medium for future generation, it is necessary to make small, by some extent, a track pitch of a data recording track formed with the fine pattern of a layer of the magnetic material (i.e., magnetic layer). Accordingly, it is necessary to reduce, by some extent, the width of a groove between the tracks formed from the magnetic layer, and this groove corresponds to a non-magnetic portion for reducing magnetic influence to the adjacent recording tacks at the time of reading the recorded data.

In this time, in a case where the resist pattern 60 formed by the resist pattern forming method of the characters mentioned above is used as a mask, and as shown in FIG. 13, a metal mask layer 61 and a magnetic layer 62 are etched to thereby form the groove, i.e., non-magnetic portion, 63, the width of the groove to be etched is narrowed, as shown with a broken line in FIG. 13, in the direction separating from the resist pattern 60 (i.e., on the lower side in FIG. 13). For this reason, in a case where the width w7 at the protrusion of the resist pattern 60 is too widened without changing the pitch for forming the data recording track 65, there may cause a fear that it may become difficult to form the groove 63 having a depth reaching the substrate 64.

Accordingly, in order to form a resist pattern having a narrow width of the protrusion, i.e., w7 in FIG. 13, it will be necessary to press the resist layer 12 formed on the surface of the substrate 11 so as to transfer the concavo-convex shape including protrusion and recess of a mold 21a having a narrow width of a recess 23a, (i.e., in other words, a wide width of the protrusion 22a) shown in FIG. 14a.

However, as shown in FIG. 14A, it is more difficult to form the resist pattern having the narrow width of the protrusion by pressing mold 21a, against the resist layer, having the recess 23a having a narrow width than to form the resist pattern having the protrusion having a wide width by pressing the mold having the wide width of a recess 23b shown in FIG. 14B. That is, in the case of using the mold 21a having the narrow recess 23a, it contacts the resist layer 12 at a wide area, which requires a high load to the mold 21a for pressing the resist layer 12, and in addition, the formed resist pattern may be ready peeled at the time of separating the mold 21a from the resist layer 12. Such adverse phenomenon will become remarkable in a case of using a mold having a line-and-space pattern in which recesses and protrusions are periodically arranged as shown in FIGS. 14A and 14B.

SUMMARY OF THE INVENTION

The present invention was conceived in consideration of the above matters encountered in the prior art mentioned above and a first object of the present invention is therefore to provide a method of easily forming a resist pattern provided with a protrusion (protruded portion) having a narrow width involving no adverse phenomenon of peeling-off of the once transferred resist pattern at the time of manufacture.

A second object and a third object of the present invention are to provide a method of manufacturing a magnetic recording medium and a method of manufacturing a magnetic head, respectively, both utilizing the resist pattern forming method obtainable in accordance with the first object mentioned above so as to satisfy the requirement of realizing high recording density and high capacity thereof.

These and other objects can be achieved according to the present invention by providing, in a first aspect, a method of forming a resist pattern comprising the steps of:

preparing a substrate on which a resist layer is formed and a mold having a concavo-convex surface including protrusion and recess forming a pattern;

transferring the pattern of the mold to the resist layer on the substrate by an imprinting method; and etching a side surface of a protrusion of the resist pattern transferred to the resist layer so as to form the protrusion having a width narrower than a width of the corresponding recess formed to the mold.

According to this aspect, it becomes possible to form a resist pattern provided with a protrusion having a width narrower than a width of a corresponding recess formed to the mold by etching the side surface of a protrusion of the resist pattern transferred from the mold to the resist layer formed on the substrate. Therefore, a mold having a protrusion having a narrow width (in other words, a recess having a wide width) can be easily utilized for transferring of the pattern by an imprinting method, which contributes to a reduction of contacting area to the resist layer and a reduction of high load at the time of pressing the resist layer. In addition, a pattern peeling-off phenomenon, which is liable to be caused at a time of the separation of the mold from the resist layer, can be remarkably reduced from causing.

In a preferred embodiment of the above aspect, it may be desired that the etching to the side surface of the protrusion of the resist pattern is carried out together with the removal of a layer of the resist remaining in the recess of the resist pattern, and at least one of a thickness of the resist remaining layer and a width of the recess of the mold is changed so that the protrusion of the resist pattern provides a predetermined width at substantially the same time as completion of the removal of the resist remaining layer.

According to this embodiment, in a case where the resist remaining layer is completely removed, the etching finishing time can be determined to be a time at which the thickness of the resist remaining layer becomes substantially zero or slightly exceeds zero, so that the lower structure of the resist layer can be prevented from being damaged.

Further, in the case where the thickness of the resist remaining layer is changed, the resist pattern having different widths of the protrusions can be formed, even in the case of using the same mold, by changing the thickness of the resist remaining layer and completely removing the resist remaining layer by the etching treatment.

Furthermore, it may be desired that the etching to the side surface of the protrusion of the resist pattern is carried out together with the removal of a layer of the resist remaining in the recess of the resist pattern, and a thickness of the resist remaining layer is made sufficient for suppressing a generation of defect due to peeling-off of the resist layer at a time of separating the mold from the resist layer formed on the substrate after the transferring of the pattern of the mold to the resist layer.

According to this embodiment, the etching to the side surface of the protrusion of the resist pattern is carried out together with the removal of the resist remaining layer, and the thickness of the resist remaining layer is made sufficient for suppressing the generation of defect due to peeling-off of the resist layer at a time of separating the mold from the resist layer formed on the substrate after the transferring of the pattern. Therefore, the peeling-off phenomenon which is liable to be caused at the separation of the mold from the resist layer can be prevented from being caused, thus forming the resist pattern with less defect.

In the above aspect, it is also desired that the etching is a plasma etching.

The application of the plasma etching to the resist layer permits the etching speed to be made appropriately faster in the thickness direction than in the width direction, so that the protrusion of the resist pattern is etched so as to reduce its width while effectively removing the resist remaining layer.

In a second aspect of the present invention, there is provided a method of manufacturing a magnetic recording medium comprising the steps of preparing a resist pattern formed by utilizing the method of forming a resist pattern of the characters mentioned above directly or indirectly as a mask; and working a magnetic layer by utilizing the mask.

According to this aspect, since the fine pattern formation in the magnetic recording medium manufacturing method can be done by utilizing the method of forming the resist pattern of the above aspect of the present invention, a resist pattern which serves as an etching mask having less defect and a protrusion having a narrow width can be manufactured at a high yield. As a result, by using such resist pattern as the etching mask in the etching process, the magnetic recording medium having an increased high recording density and increased high capacity can be easily manufactured also at a high yield.

Furthermore, in another aspect of the present invention, there is provided a method of manufacturing a magnetic head comprising the steps of preparing a resist pattern formed by utilizing the method of forming a resist pattern of the characters mentioned above directly or indirectly as a mask; and forming a pole by utilizing the mask.

According to this aspect, since the fine pattern formation in the magnetic head manufacturing method can be done by utilizing the resist pattern forming method of the above aspect of the present invention, a resist pattern which serves as an etching mask having less defect and a protrusion having a narrow width can be manufactured at a high yield. As a result, by using such resist pattern as the etching mask in the etching process, the magnetic head having an increased high recording density and increased high capacity can be easily manufactured also at a high yield.

The nature and further characteristic features of the present invention will be made more clear from the following descriptions made with reference to the accompanying drawings.

DESCRIPTION OF THE PREFERRED EMBODIMENT

Figure 1A:
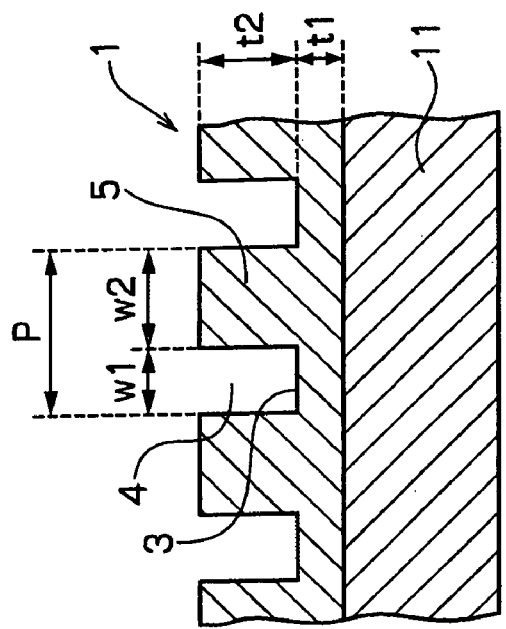
FIG. 1 includes FIGS. 1A to 1D, which partially show sectional views of a resist pattern in accordance with forming steps of a resist pattern forming method as an embodying mode of one embodiment of the present invention.

The best modes for embodying the present invention of the resist pattern forming method, and the magnetic recording medium manufacturing method and magnetic head manufacturing method, both utilizing the resist pattern forming method according to the present invention, will be described hereunder as preferred embodiments with reference to the accompanying drawings.

With reference to FIG. 1, a method of forming a resist pattern 2 of the present invention is characterized by the steps represented by FIGS. 1A to 1D, respectively. That is, in this method, a pattern of a mold (mould) 21 having a concavo-convex shape including recesses and protrusions, may be substituted with concave-convex shape, which is transferred to a resist layer 12 formed on a substrate 11 by an imprinting method. Further, it is to be noted that these recesses and/or protrusions will be mentioned hereunder each as single one for the sake of explanation. Thereafter, the side surface of the protrusion of the transferred resist pattern 1 (FIG. 1C) is etched to thereby form the resist pattern 2 (FIG. 1D) provided with the protrusion 15 having a narrow width w4 smaller than a width w6 of a corresponding recess 23 formed on the mold 21.

In the resist pattern forming method of the embodiment of the present invention, the mold 21, which is provided with the recess 23 having a wide width w6 (having high ratio of the width w6 of the recess 23 in a pitch P), is utilized because a pressing operation can be relatively easily performed, and there is less fear of peeling off the resist at the time of separating the mold 21 from the resist layer 12.

By using such mold 21, the resist layer 12 formed on the surface of the substrate 11 is pressed to thereby transfer the resist pattern 1 having the wide width w2 of the protrusion 5 (having high ratio of the width w2 of the protrusion 5 in the pitch P). In this step, a layer 3 composed of the resist material remaining in the recess, which may be called "resist remaining layer 3" hereunder, remains as it is. Thereafter, this resist remaining layer 3 is etched and removed, and at this time, the side surface of the resist pattern 1 having the wide width w2 of the protrusion 5 (FIG. 1C) is also etched, thus forming the resist pattern having a narrow width of the protrusion 15 (FIG. 1D).

As mentioned above, the present invention can use the mold 21, which is easily applicable to the pattern transferring in the imprinting method, provided with the protrusion 22 having the narrow width w5 (i.e., mold 21 provided with the recess 23 having the wide width w6). The use of such mold 21 contributes to the reducing of an area contacting the resist layer 12 and requires no high load at the pressing step. In addition, a fear of causing such pattern peeling-off phenomenon, which may be often caused at the time of separating the mold 21 from the resist layer 12, can be effectively eliminated, thus being advantageous.

In order to keep remain the resist remaining layer 3 (i.e., the layer 3 of the resist material remaining in the recess) in a thick thickness, it may be possible, for example, to make thick the thickness t4 of the resist layer 12 coated on the substrate 11 or to press the resist layer 12 by the mold 21 at a low load.

In general, the thickness t1 of the resist remaining layer 3 is influenced by a pattern shape to be formed, a kind of resist material to be used, a kind of plasma to be utilized for the etching treatment and so on, so that it is difficult to clearly define the thickness. However, in the preferred embodiment of the present invention, for example, by changing the thickness t1 of the resist remaining layer 3, the etching time is changed to thereby control the width w4 of the protrusion 15. That is, in a case where the same mold 21 is used, the thickness t1 of the resist remaining layer 3 is changed, and the etching treatment is effected to remove the resist remaining layer 3, thereby forming various resist patterns 2 having different widths w4 of the protrusions 15.

In this process, the etching speeds in the resist thickness direction (i.e., height direction as viewed) and the resist width direction (i.e., inward direction on the drawing as viewed) are considered, and the thickness t1 of the resist remaining layer 3 is determined by considering the magnifying degree of the width w2 of the protrusion 5 of the resist pattern 1.

As mentioned above, according to the present invention, the etching to side surface of the protrusion 5 of the resist pattern 1 is carried out together with the removal of the layer 3 of the resist remaining in the recess 4 of the transferred resist pattern 1, at least one of the thickness t1 of the resist remaining layer 3 and the width w6 of the recess 23 of the mold 21 is changed so that the protrusion 15 of the resist pattern 2 provides the predetermined width w4 at substantially the same time as completion of the removal of the resist remaining layer 3.

Here, it is to be noted that the state, in which the etching to the side surface of the protrusion 5 of the resist pattern 1 is carried out together with the removal of the resist remaining layer 3 in the recess, includes (1) a state that the etching to the side surface of the protrusion 5 of the resist pattern 1 is carried out simultaneously with the etching removal of the resist remaining layer 3 and (2) a state that the etching to the side surface of the protrusion 5 of the resist pattern 1 is continuously carried out after the removal of the resist remaining layer 3. Moreover, the term "substantially at the same time" includes (1) a time where the thickness t1 of the resist remaining layer 3 becomes zero and a time where the thickness exceeds slightly over zero in the case (a) where the etching removal of the resist remaining layer 3 has been completely finished, and (2) a time where the thickness t1 of the resist remaining layer 3 becomes not zero but considerably thin in the case (b) where the etching removal of the resist remaining layer 3 has not completely been finished and then removed in the next etching treatment (process).

Further, in the viewpoint of preventing the peeling of the resist layer, which is liable to cause at a time of removing the mold 21 from the resist layer after the transfer of the pattern, it is desirable to determine the thickness t1 of the resist remaining layer 3 to be sufficient for effectively suppressing the causing of the defect of the peeling-off of the resist layer.

The thickness t1 of the resist remaining layer 3 is determined by the adhesive force between the substrate 11 and the resist layer 12, the thickness t4 of the resist layer 12 to be formed, and others. Further, it may be better to form the resist remaining layer 3 so as to have the thickness t1 of more than (not less than) 20 nm, and more preferably, not less than 50 nm though it is not necessary to specifically limit its thickness to this value. By setting this thickness, the fear of causing such defect due to the peeling-off of the resist layer at the mold separating time could be preferably eliminated.

A plasma etching method, such as oxygen plasma method, argon plasma method and the like, may be preferred as the etching technology for etching the side surface of the protrusion 5 of the resist pattern 1. In such plasma etching method, the etching speed to the resist layer is appropriately higher in the thickness direction thereof than in the width direction, and according to such method, the width w2 of the protrusion 5 of the resist pattern 1 (i.e., the width w4 of the protrusion 15) can be made narrow while effectively removing the resist layer 3 remaining in the recess 4 of the resist pattern 1. More specifically, it is desired that the etching speed ratio in the width direction of the resist layer to the thickness direction thereof (width direction/thickness direction) is in a range of 0.4 to 1.0.

In the present invention, it may be possible to carry out the etching method to the resist pattern 1 by using an ozone in place of the plasma etching method, mentioned above, utilizing the oxygen, for example. In the etching method utilizing the ozone, the etching speed in the width direction of the resist pattern is almost equal to that in the thickness direction thereof, so that the etching is carried out to the protrusion 5 of the resist pattern 1, from the width direction thereof, by the time required for the etching removal of the thickness t1 of the resist remaining layer 3, and in this manner, the width w2 (i.e., width w4 of the protrusion 15) can be narrowed.

Further, according to the present invention, a plurality of etching methods may be applied in combination thereof as occasion demands.

Further, the final point of time of such etching treatment is considered to be desirable at a time when the thickness t1 of the resist remaining layer 3 becomes zero or slightly over zero in the viewpoint of preventing the damage to the lower structure of the resist layer. Furthermore, there may be adopted an etching mode to the side surface of the pattern which is continued after the thickness t1 of the resist remaining layer 3 became zero.

The resist pattern forming steps of processes according to the resist pattern forming method of the present invention will be described hereunder with reference to the accompanying drawings.

Figure 2:
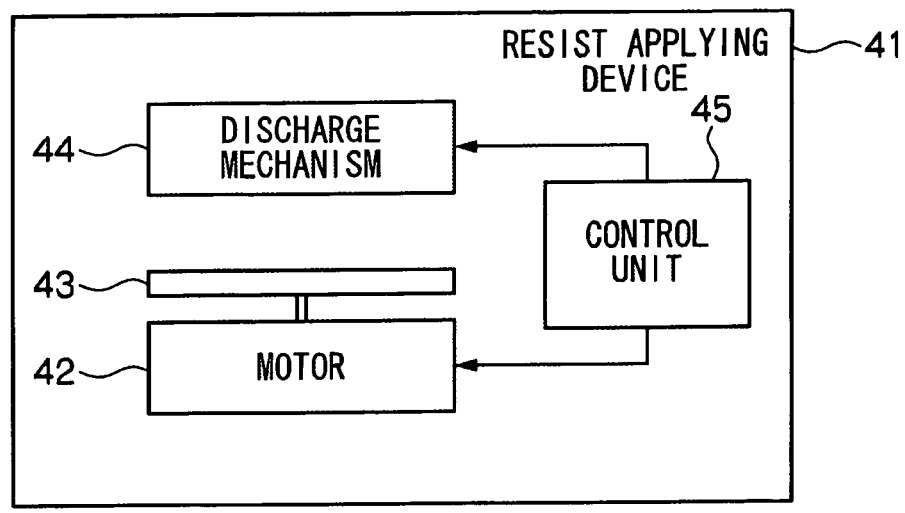
FIG. 2 is a block diagram showing a structure of a coating apparatus usable for the resist pattern forming method of the embodiment of FIG. 1.
Figure 3:
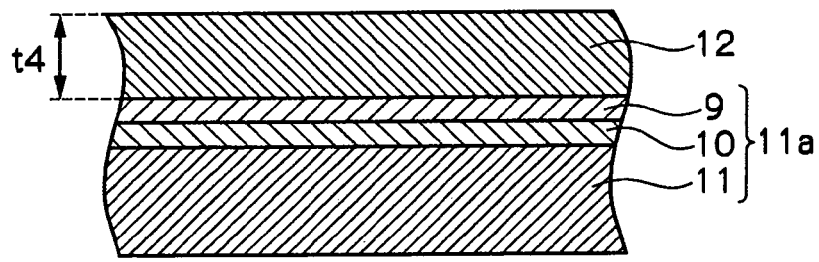
FIG. 3 is a sectional view of a disk-shaped substrate on which a magnetic layer, a metal mask layer and a resist layer are formed.

FIG. 2 shows a resist applying device 41, which is a device for forming the resist layer 12 by applying a resist material on the front surface side of the disk shaped substrate 11a (FIG. 3). This resist applying device 41 comprises a motor 42, a turn-table 43, a discharge mechanism 44 and a control unit 45.

The motor 42 in the resist applying device 41 constitutes a driving mechanism for rotating the turn-table 43 in response to an electric signal from the control unit 45.

The turn-table 43 is driven (rotated) by the motor 42 and has a structure on which the disk shaped substrate 11a can be mounted.

The discharge mechanism 44 serves to discharge the resist material (for example, polystyrene based copolymer) to an inner peripheral portion of the substrate 11a disposed in the turn-table 43 (i.e., to a portion slightly outer peripheral side of a hole formed to the central portion thereof).

The control unit 45 serves to control the rotation (revolution) of the motor 42 and the discharging of the resist material in the discharge mechanism 44 so as to make the thickness t4 (FIG. 3) of the resist layer 12 to a predetermined value.

The disk-shaped substrate 11a mentioned hereinabove is a substrate for a discrete-track type recording medium (called herein "discrete track medium"), in which the base substrate 11 is formed from a glass material to provide a circular shape. In such example, on the surface of the disk-shaped substrate 11a in the completed state, a plurality of data recording tracks (which may be called herein "discrete track") are formed concentrically with each other at a predetermined arrangement (pitch) of 150 nm, for example. The disk-shaped substrate 11a mentioned herein is a substrate comprising a substrate 11 as a base, and a magnetic layer 10 and a metal mask layer 9 which are preliminarily formed on the base substrate 11. Such substrate 11a may be called "disk-shaped substrate 11a" or, merely, "substrate 11a" hereinlater. In this structure of the substrate 11a, in order to enable perpendicular recording, the magnetic layer 10 is formed of a soft magnetic layer as a lined (backing) layer and a recording magnetic layer, both not shown, which are laminated in this order from the substrate 11a side.

Figure 4:
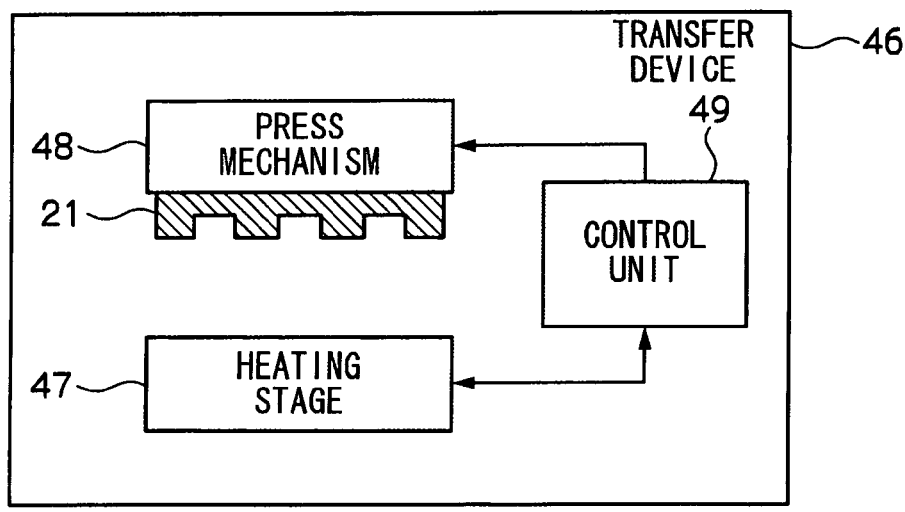
FIG. 4 is a block diagram showing a structure of a transferring apparatus usable for the resist pattern forming method of the embodiment of FIG. 1.

On the other hand, a transfer device 46 shown in FIG. 4 is a device for transferring the pattern to the resist layer 12 formed on the front surface side of the disk-shaped substrate 11a. This transfer device 46 comprises a heating stage 47, a press mechanism 48, a control unit 49 and a mold 21.

The heating stage 47 in this transfer device 46 has a structure on which the disk-shaped substrate 11a having the resist layer 12 can be mounted and serves to heat the resist layer 12 and the substrate 11a in response to a control signal from the control unit 49.

The press mechanism 48 has a structure to which the mold 21 can be fixed and serves to press (or depress) the mold 21 towards the heating stage 47 in response to a control signal from the control unit 49, and in this structure, the press mechanism 48 may be provided with a heating function for heating the mold 21 in the fixed state.

The control unit 49 serves to control the heating of the heating stage 47 and the heating and pressing of the press mechanism 48.

Figure 5:
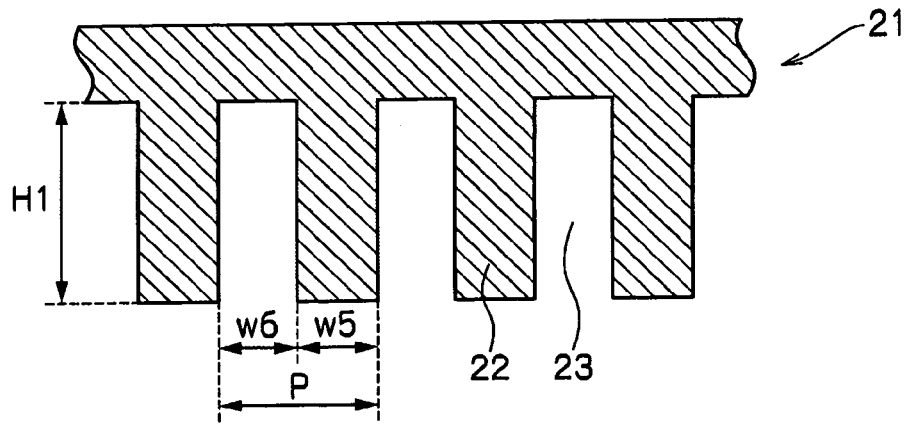
FIG. 5 is a sectional view showing a structure of a mold for the transferring apparatus of FIG. 4.

The mold 21 has a disk-plate structure entirely. As shown in FIG. 5, the mold 21 has a concavo-convex front surface so as to provide concavo-convex (protrusions and recesses) shape so as to form the resist pattern to the resist layer 12. The concavo-convex surface of the mold 21 is subjected to a coating treatment with, for example, a fluoride based material for preventing the adhesion of the resist material to the mold 21 at the time of separating the mold 21 from the resist layer 12 in the resist pattern forming process. The formation of such concavo-convex surface including the protrusion and recess to the mold 21 will be performed, for example, by utilizing an electron beam lithograph device and a reactive ion etching device. Further, it is to be noted that, for the sake of easy understanding of the gist of the present invention, in the illustrations of the accompanying drawings, the concavo-convex shape, i.e., protrusions and recesses of the mold are shown in an enlarged scale, and the description will be made with reference to single protrusion and/or single recess.

The resist pattern according to the present invention will be formed in the following steps by using the resist applying device 41 and the transfer device 46 both of the structures mentioned above.

First, the disk-shaped substrate 11a is mounted on the turn-table 43 and then, the resist applying device 41 starts to operation.

In accordance with this operation start of the resist applying device 41, the control unit 45 generates control signals to the motor 42 and the discharge mechanism 44. That is, the turn-table 43, on which the substrate 11a is mounted, is rotated 5-times at a low speed by the control signal given to the motor 42, and the resist material, for example, polystyrene resin base copolymer, of predetermined amount is discharged to the inner peripheral portion of the substrate 11a by the control signal given to the discharge mechanism 44.

Then, the control unit 45 generates, to the motor 42, a control signal for driving the turn-table 43 at a high rotation speed for a predetermined time interval. In this operation, in accordance with the rotation of the turn-table 43, the disk-shaped substrate 11a is rotated at a high speed, and the discharged resist material is expanded with uniform thickness towards the outer peripheral direction of the disk-shaped substrate 11a. According to such operation, the resist layer 12 is formed on the surface of the substrate 11a with a predetermined thickness t4 of, for example, 100 nm.

In the next step for forming the resist pattern to the resist layer 12 by using the transfer device 46, the disk-shaped substrate 11a provided with the resist layer 12, the metal mask layer 9 and the magnetic layer 10 is rested on the heating stage 47, and then, the transfer device 46 is driven to start its operation. According to this operation start of the transfer device 46, the control unit 49 generates control signals to the heating stage 47 and the press mechanism 48. That is, the resist layer 12 and the disk-shaped substrate 11a are heated in accordance with the control signal given to the heating stage 47, and the mold 21, which is fixed to the heating stage 47, is also heated in accordance with the control signal given to the press mechanism 48.

In this operation, when the temperature of the resist layer 12 exceeds the glass transition temperature of the resist material (in the present case, 105° C. of the glass transition temperature of polystyrene based copolymer), the resist layer 12 is softened to be deformable. Then, the control unit 49 generates a control signal to the press mechanism 48 to start the pressing operation at the time of confirmation of the reaching of the temperature of the mold 21 to the temperature of, for example, 170° C., higher than the glass transition temperature of the resist material. In accordance with this signal from the control unit 49, the press mechanism 48 presses the mold 21 at a pressure of, for example, 2.1 MPa (21.2 kgf/cm$^2$).

Figure 6:
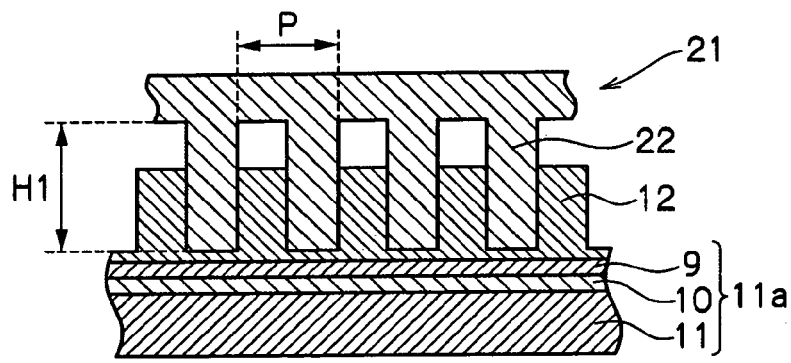
FIG. 6 is a sectional view showing a state that the mold is pressed against the resist layer.

In this operation, as shown in FIG. 6, the protrusion 22 of the surface of the mold 21 is pressed against the resist layer 12, and the resist material forming the resist layer 12 is deformed, the deformed portion intruding into the recess 23, which is also formed to the surface of the mold 21. Following to this step, the control unit 49 generates a control signal to stop the pressing operation of the press mechanism 48 and also generates control signals to the heating stage 47 and the press mechanism 48 to stop their heating operations. In response to these control signals, the heating stage 47 stops its heating operation and the press mechanism 48 stops its heating and pressing operations. Under the state, the resist layer 12, the disk-shaped substrate 11a and the mold 21 are left alone till their temperatures lower to the room temperature. In this case, a cooling mechanism may be additionally located so as to forcibly lower the temperature thereof.

Figure 7:
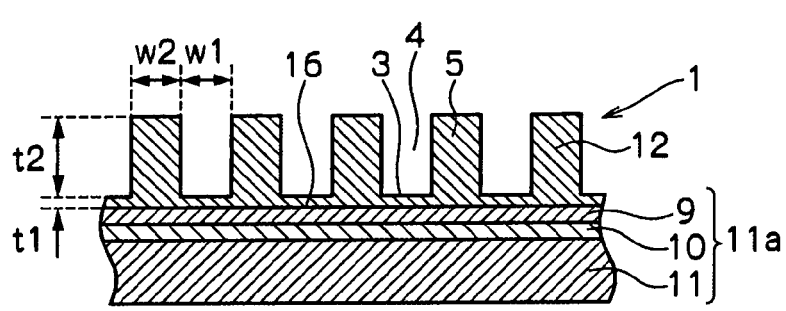
FIG. 7 is a sectional view showing a state of the resist layer to which the pattern of the mold is transferred.

In the next step, the mold 21 is separated from the resist layer 12, and the concavo-convex shape including the protrusion and recess of the mold 21 is transferred to the resist layer 12 through the separation of the mold 21 therefrom. Further, in this separation, by pressing the mold 21 into a position at which the front (tip) end of the protrusion 22 does not reach so deep position of the resist layer 12, the resist pattern 1 is formed, as shown in FIG. 7, in which the distance between the bottom surface of the recess 4 and the surface 16 of the disk-shaped substrate 11a is maintained to be considerably long (for example, 52 nm) and the resist layer 3 remains in the recess. Otherwise, by forming the thickness t4 of the resist layer 12 to be thick, as mentioned before, the resist pattern 1 can be formed with the resist layer 3 (thickness t1) remaining in the recess.

In the next step, the disk-shaped substrate 11a provided with the resist layer 12, on which the concavo-convex shape of the mold 21 is transferred, is moved to the plasma etching device, not shown, and the oxygen plasma is irradiated to the entire surface of the resist layer 12 to thereby perform the plasma etching, whereby the resist remaining layer 3 remaining in the recess 4 is removed and the side surface of the pattern of the protrusion 5 is subjected to the etching treatment.

Figure 8:
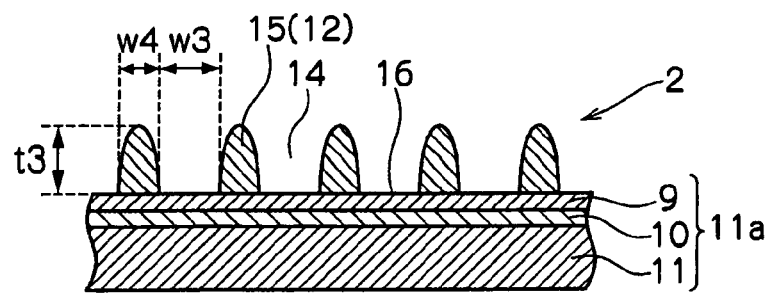
FIG. 8 is a sectional view showing a state of the resist layer which is subjected to an etching treatment.

According to such etching treatment, as shown in FIG. 8, a desired resist pattern 2 provided with the protrusion 15 having a narrow width w4 narrower than the width w6 of the corresponding recess 23 formed on the mold 21 can be formed.

The resist pattern forming method of the present invention of the characters mentioned above will be described more in concretely by way of steps of one preferred mode of the method represented by FIG. 1.

First, as shown in FIG. 1A, the mold 21 was prepared by the electron-beam lithography method and the reactive ion etching treatment so that the mold 21 has a recess 23 having a width w6 of 126 nm, a depth H1 of 230 nm and a pitch P is 200 nm.

Figure 1B:
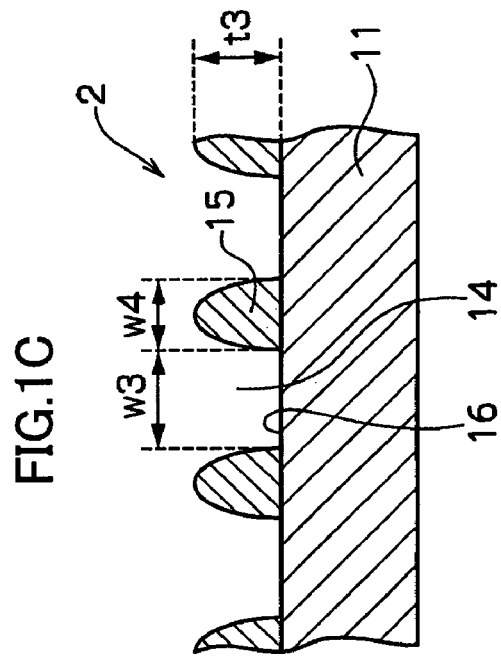

Next, as also shown in FIG. 1B, the resist layer 12 was then formed on the surface of the substrate 11 so as to provide a thickness t4 of 100 nm. The mold 21 and the substrate 11 on which the film of the resist layer 12 was formed were set to a press or pressing device, and they were heated to a temperature of 170° C. and pressed at 2.1 MPa (21.2 kgf/cm$^2$).

Figure 1C:
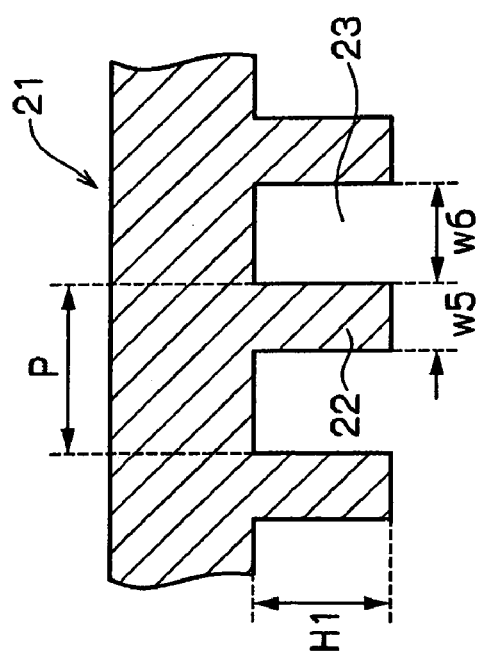
Figure 1D:
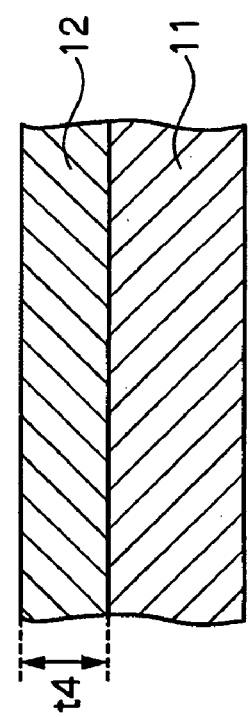

The mold 21 and the substrate 11 were cooled under the pressed state to a temperature of 35° C., and the mold 21 was then separated from the substrate 11. By this process, the resist pattern 1 such as shown in FIG. 1C was transferred to the resist layer 12. In the illustrated embodying mode of the method, the thickness t2 of the protrusion 5 of the resist pattern 1 was 107 nm and the thickness t1 of the resist remaining layer 3 (i.e., layer 3 of the resist material remaining in the recess) was 52 nm.

In the next step, the resist pattern 1 was etched by means of oxygen plasma at an etching speed of about 15 nm/minute in the width direction and about 20 nm/minute in the thickness direction. After the removal of the resist remaining layer 3, as shown in FIG. 1D, the width w4 of the protrusion 15 of the obtained resist pattern 2 was 80 nm. Thus, the resist pattern 2 having the narrow width w4 of the protrusion 15 could be formed from the mold 21 having the wide width w6 of the recess 23.

[Manufacturing Method of Magnetic Recording Medium]

Hereunder, the process for producing a discrete track medium 9 by utilizing a resist layer, as a mask, to which the resist pattern is formed and forming the discrete track formed from the magnetic layer on the surface of the disk-shaped substrate will be described with reference to FIG. 9. Further, in this process, since the reactive ion etching is a known technology, the detail thereof is omitted herein.

Figure 9A:
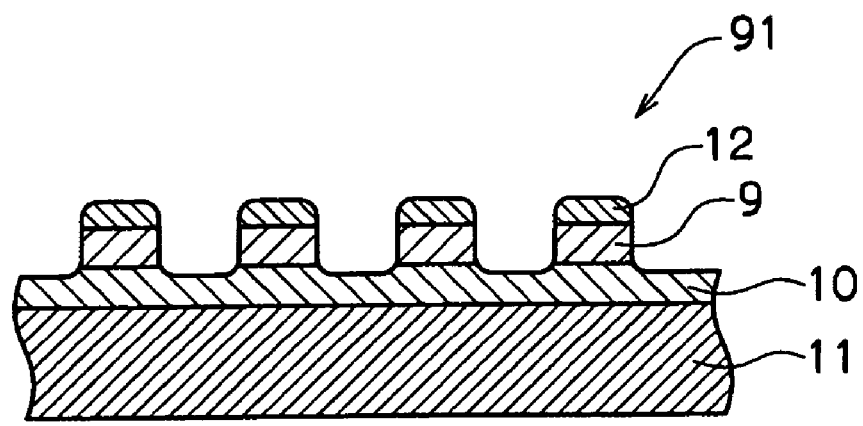
FIG. 9 includes FIGS. 9A to 9C which represent steps of one example of a magnetic recording medium manufacturing method according to another embodiment of the present invention.

In this process, the reactive ion etching treatment is performed to the metal mask layer 9 by using the resist pattern 2, as the mask, formed in accordance with the mode represented by FIG. 8. According to this reactive ion etching treatment, the metal mask layer 9 exposed from the resist pattern 2 (FIG. 8) is removed as shown in the step of FIG. 9A to thereby form a metal mask pattern 91. At this time, the surface layer of the magnetic layer 10 (corresponding to a portion of the metal mask layer removed portion) is also partially removed. Further, in this treatment, almost the resist layer 12 formed from the protruded-shape portion is removed, but the other small portion remains on the metal mask layer 9.

Figure 9B:
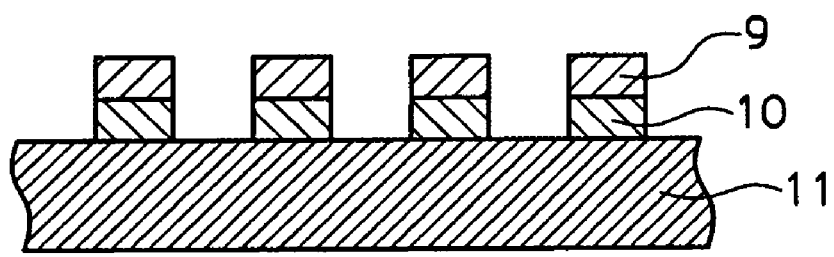

Next, by using the thus formed metal mask pattern 91 as a mask, the reactive ion etching treatment is effected to the magnetic layer 10. At this time, as shown in FIG. 9B, a portion of the magnetic layer 10 corresponding to the portion exposed from the metal mask pattern 91 is removed and the resist layer 12 is also removed entirely.

Figure 9C:
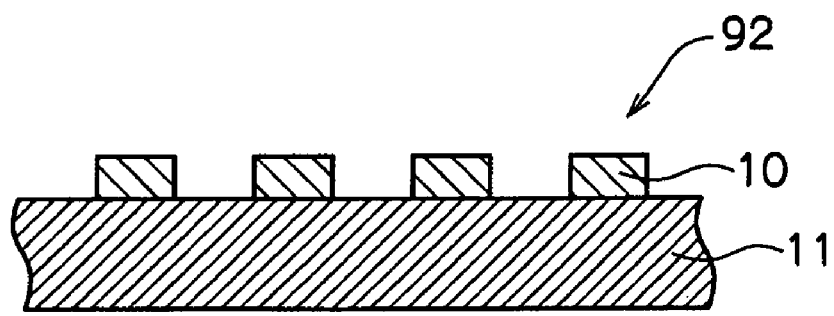

The reactive ion etching treatment utilizing a gas for the metal mask etching is thereafter performed so as to remove the remaining metal mask layer 9. According to these processes, the discrete track 92 is formed as shown in FIG. 9C.

Finally, a surface finishing treatment is performed. In this surface finishing treatment, an oxidized silicone, for example, fills in a gap between the separated magnetic layers 10, 10, - - - 10, and thereafter, the surface is polished to make it flat by using a CMP device (Chemical-Mechanical Polishing Device). A DLC (Diamond-Like Carbon), for example, is then applied to the polished surface so as to form a protection film, and finally, a lubricant is coated. According to this process, the discrete track type magnetic recording medium can be completed.

In the above disclosure, although there is provided one preferred embodying mode of applying the resist pattern forming method according to the present invention to the manufacture of the discrete track type magnetic recording medium, the present invention is not limited to such mode, and the present invention is also applicable to the manufacture of a magnetic disk in which dividable recording elements are formed side by side with minute interval in a circumferential (sector) direction of the track, a magnetic disk in which the dividable recording elements are formed side by side with minute interval in both diametrical direction and circumferential (sector) direction of the track, and a magnetic disk in which the divisional recording element forms a spiral shape.

Moreover, the present invention is also applicable to the manufacture of an optical magnetic disk such as MO and a discrete type magnetic recording medium other than the disk-shaped one such as magnetic tape.

Furthermore, the resist pattern forming method according to the present invention is applicable to the manufacture of a magnetic head, various kinds of semiconductor devices and the like as well as the magnetic recording medium described hereinbefore.

[Magnetic Head Manufacturing Method]

A magnetic head manufacturing method according to a further embodiment of the present invention will be described hereunder.

There is widely known, as a thin-film (type) magnetic head, a compound type thin-film magnetic head having a structure in which a recording head having an induction type magnetic conversion element for recording and reading head having an MR (magneto resistive) element for reading are laminated. As such MR element, an AMR (anisotropic magneto resistive) element utilizing an anisotropic magneto resistive effect and a GMR (giant magneto resistive) element utilizing a giant magneto resistive effect are known. A reading head utilizing such AMR element is called AMR head or, merely, MR head and, on the other hand, a reading head utilizing such GMR element is called GMR head. The GMR element exhibits a large resistance change, in comparison with the AMR element, at a time of applying the same external magnetic field, and for this reason, the GMR head can generate a reading output three or five times larger than that of the AMR head.

According to the increased improvement in the performance of the reading head, an improvement in the performance of a recording head is also required. In order to increase the recording density in the recording head performance, it is necessary to increase the track density of the magnetic recording medium. In order to increase the track density, it is required to realize a recording head having a narrow track structure in which a width between a bottom pole and a top pole vertically formed with write gap being sandwiched therebetween is narrowed on an air bearing thereof to a sub-micron order, and in order to realize such a recording head, a semiconductor working technology has been utilized.

Figure 10A:
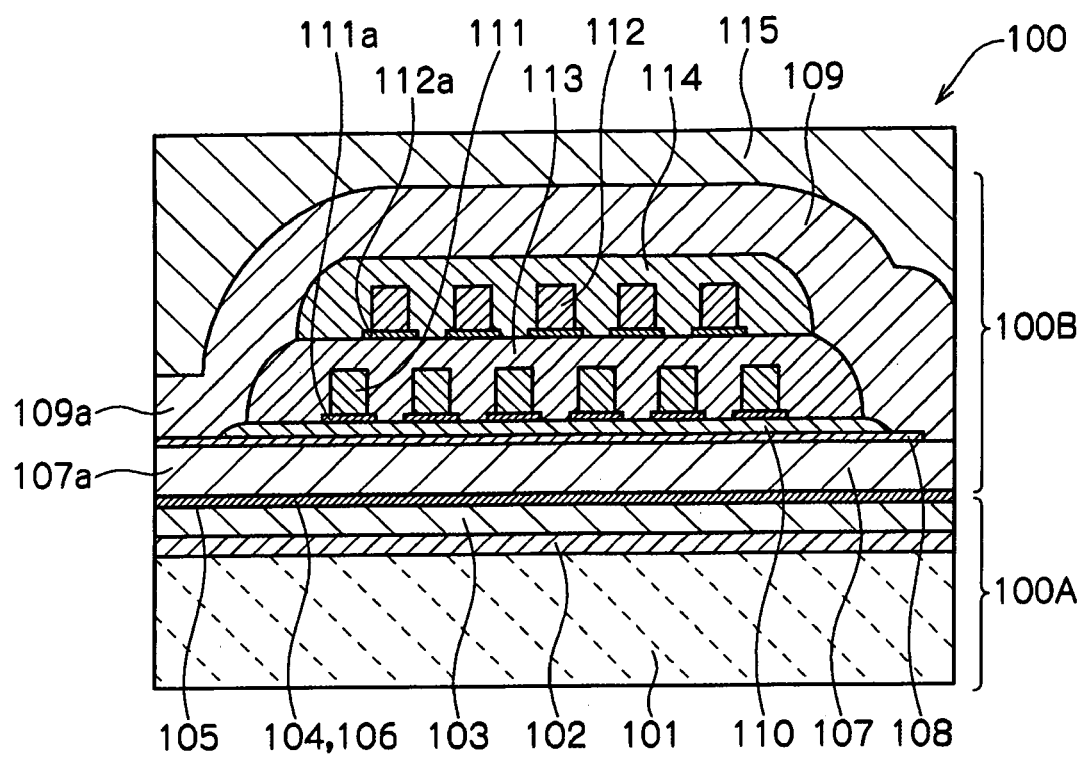
FIG. 10 includes FIGS. 10A and 10B showing sectional views of a composite-type thin film magnetic head as one example of a thin film magnetic head according to another embodiment of the present invention.
Figure 10B:
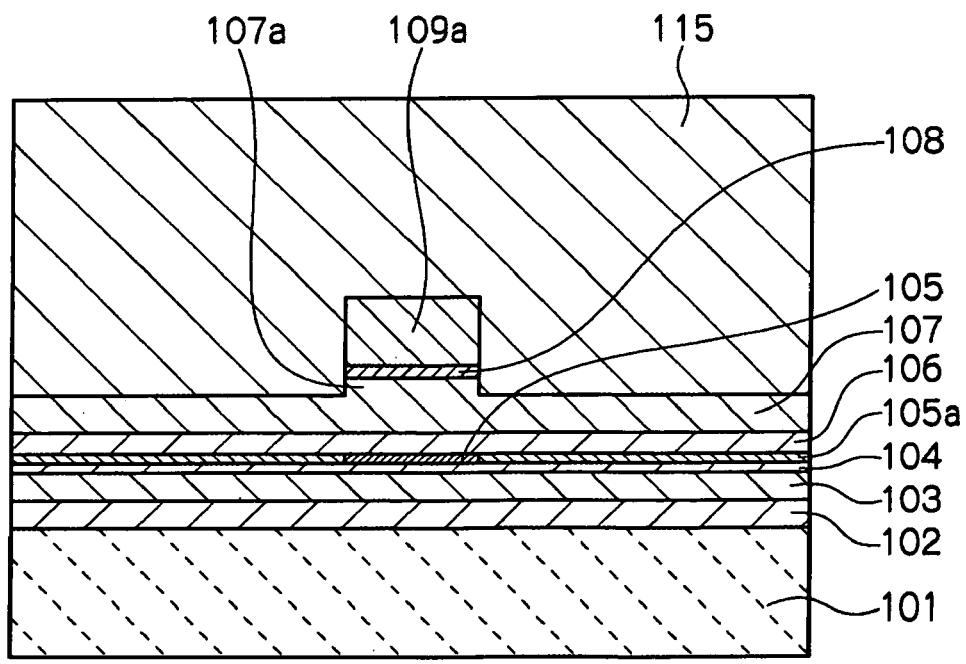

FIG. 10 shows a sectional structure of a compound type thin film magnetic head as one example of the thin film magnetic head mentioned above. In this FIG. 10, FIG. 10A shows a vertical section of the track surface and FIG. 10B shows a section parallel to the track surface of the pole portion thereof.

The magnetic head 100 in FIG. 10 is provided with a magnetoresistance effect reading head for reading (called merely reading head, hereinlater) 100A and an inductive recording head for recording (called merely recording head, hereinlater) 100B.

The reading head 100A is composed of a base layer 102, a lower shield layer 103 and a shield gap layer 104, which are laminated in this order on a substrate 101 so as to form a pattern of a magnetoresistance effect layer (MR layer) 105. Moreover, a lead terminal layer 105a, which is formed from a material not diffusing into the MR layer 105, may be formed on the shield gap layer 104. This lead terminal layer 105a is electrically joined to the MR layer 105, and a shield gap layer 106 is also laminated on the MR layer 105 and the lead terminal layer 105a.

The recording head 100B is composed of a bottom pole 107, which also serves as an upper shield layer to the MR layer 105, a gap layer 108 and a top pole 109a, which are laminated in this order on the reading head 100A. A thin film coil 111 as a first layer and another thin film coil 112 as a second layer are laminated on the gap layer 108. These first and second layers 111 and 112 are covered by insulating layers 113 and 114, respectively, and a top pole layer 109 including the top pole 109a is formed on the insulating layers 113 and 114 so as to cover these layers. The top pole layer 109 is also covered by an overcoat layer 115. In this recording head 100B, the bottom pole 107a corresponding to the top pole 109a has a trim structure in which the surface of the upper shield layer 107 is partially formed as a projection (protruded portion).

With this magnetic head 100, the reading head 100A serves to read information from a magnetic disk, not shown, utilizing the magnetoresistance effect of the MR layer 105, and on the other hand, the recording head 100B serves to write information to the magnetic disk utilizing the change of magnetic flux between the top pole 109a and the bottom pole 107a.

FIG. 11 shows steps for a method of manufacturing the pole of the compound type thin film magnetic head, and particularly, the pole of the recording head by the resist pattern forming method according to the embodiment of the present invention mentioned hereinbefore.

Figure 11A:
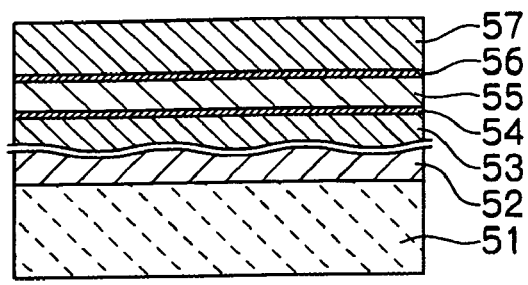
FIG. 11 includes FIGS. 11A to 11E representing steps of manufacturing the magnetic head utilizing the resist pattern forming method of the embodiment of the present invention.

In a step of FIG. 11A, an insulating layer 52 composed of alumina $Al_2O_3$, for example, is formed, by a sputtering (sputter) method, on a substrate 51 composed of $Al_2O_3TiC$, for example, so as to provide a thickness of about 3 to 5 µm.

Next, although not shown, after the formation of a bottom shield layer, a recording gap layer, and an MR element or a GMR element have been formed, a magnetic layer, for example, an upper shield serving also as bottom pole (called hereinlater bottom pole) 53 composed of permalloy, for example, is formed, by the sputtering method, so as to provide a thickness of about 3 to 4 µm.

Subsequently, an insulating film, such as, recording gap layer 54 is formed by a sputtering method formed of an aluminum film, and on this recording gap layer 54, a top pole layer 55 is formed by the sputtering method. This top pole 55 is formed of a material having high saturated flux density (Hi-Bs) such as NiFe, FeN, FeZrN, or like.

In the next step, an inorganic insulating film 56 composed of, for example, alumina $Al_2O_3$ such as the same material of the recording gap layer on the top pole layer 55 by the sputtering method. This inorganic insulating film 56 constitutes an etching mask material of the top pole layer 55 (this mask material attains the same function as that of the metal mask 9 in the manufacturing method of the magnetic recording medium mentioned hereinbefore). Next, a resist layer 57 is formed on the inorganic insulating film 56. This resist layer 57 constitutes the etching mask material of the inorganic insulating film 56.

Figure 11B:
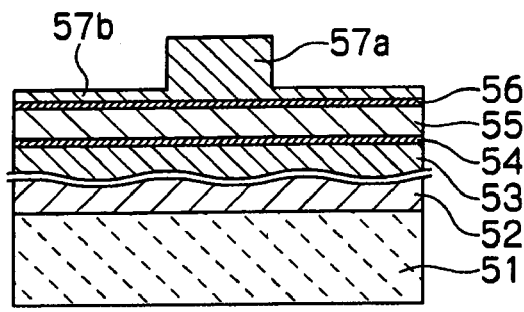

In the next step, as shown in FIG. 11B, a resist pattern 57a having a width wider than a desired pattern width (the same width as that of the pole) is transferred to the resist layer by means of mold (or stamper). That is, since a mold having a wide width of the concave (i.e., recessed) portion is used, pressing the mold and the separation from the resist layer can be easily performed with less possibility of causing the peeling-off phenomenon of the resist layer.

Figure 11C:
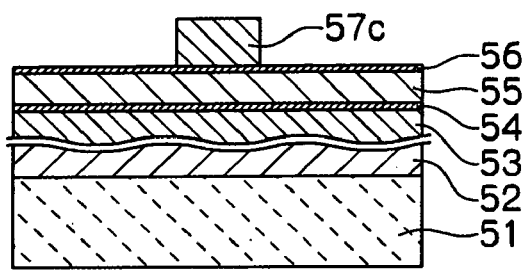

Subsequently, a resist remaining layer 57b remaining in a recess of the resist is removed by the etching treatment using an oxygen plasma, for example, and the side surface of the resist pattern 57a is also etched to thereby form a resist mask 57c, as shown in FIG. 11C, for etching the inorganic insulating film 56, having the same with as that of the pole, for example.

Figure 11D:
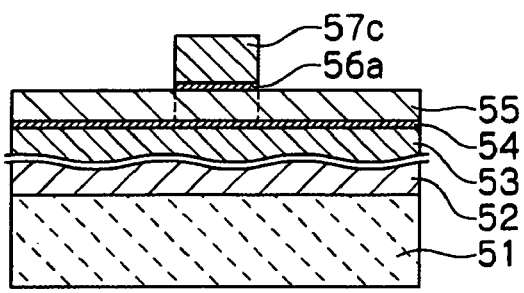

In the next step, as shown in FIG. 11D, the inorganic insulating film 56 is selectively removed by the reactive ion etching utilizing $CF_4$, $Cl_2$ or like and also using the resist mask 57c as a mask, thus forming an inorganic insulating mask 56a for etching the top pole layer 55. Further, the inorganic insulating mask 56a may be formed of a $SiO_2$ or like.

Furthermore, in the state also shown in FIG. 11D, the top pole layer 55 is selectively removed by an Ar ion milling treatment using the inorganic insulating mask 56a. At this ion milling to the top pole layer 55, although the resist mask 57c may be removed, it may be utilized as an ion milling mask material together with the inorganic insulating mask 56a. After the recording gap layer 54 has been selectively removed by the reactive ion etching, the surface of the bottom pole 53 is again etched by the Ar ion milling to thereby form the trim structure as shown in FIG. 1E or FIG. 10.

As mentioned above, according to the preferred embodiments of the present invention, the fine resist pattern can be formed at an improved yielding. Such resist pattern can be utilized as a mask for etching treatment, so that the magnetic recording medium and the magnetic head having improved high recording density and high performance can be realized and hence provided.

It is further to be noted that the present invention is not limited to the described embodiments and many other changes and modifications may be made without departing from the scopes of the appended claims.

What is claimed is:

1. A method of forming a resist pattern comprising the steps of:
    preparing a substrate on which a resist layer is formed and a mold having a concavo-convex surface including protrusion and recess forming a pattern;
    transferring the pattern of the mold to the resist layer on the substrate by an imprinting method; and
    etching a side surface of a protrusion of a resist pattern transferred to the resist layer so as to form the protrusion having a width narrower than a width of the corresponding recess formed to the mold wherein the etching to the side surface of the protrusion of the resist pattern is carried out together with removal of a layer of the resist remaining in the recess of the transferred resist pattern, and at least one of a thickness of the resist remaining layer and a width of the recess of the mold is changed so that the protrusion of the resist pattern provides a predetermined width at substantially the same time as completion of the removal of the resist remaining layer.

2. The method of forming a resist pattern according to claim 1, wherein the thickness of the resist remaining layer is changed.

3. The method of forming a resist pattern according to claim 1, wherein the etching to the side surface of the protrusion of the resist pattern is carried out together with removal of a layer of the resist remaining in the recess of the transferred resist pattern, and a thickness of the resist remaining layer is made sufficient for suppressing a generation of defect due to peeling-off of the resist layer at a time of separating the mold from the resist layer formed on the substrate after the transferring of the pattern of the mold to the resist layer.

4. The method of forming a resist pattern according to claim 1, wherein the etching is a plasma etching.

5. A method of manufacturing a magnetic recording medium comprising the steps of:

preparing a resist pattern formed by utilizing the method of forming a resist pattern according to claim 1 as a mask; and working a magnetic layer by utilizing the mask.

6. A method of manufacturing a magnetic head comprising the steps of:

preparing a resist pattern formed by utilizing the method of forming a resist pattern according to claim 1 as a mask; and forming a pole by utilizing the mask.

* * * * *

UNITED STATES PATENT AND TRADEMARK OFFICE
CERTIFICATE OF CORRECTION

PATENT NO. : 7,214,624 B2  Page 1 of 1
APPLICATION NO. : 10/982824
DATED : May 8, 2007
INVENTOR(S) : Minoru Fujita et al.

Figure 11E:
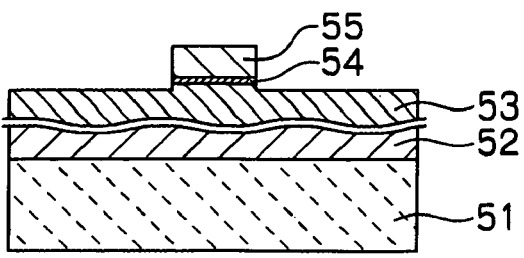
Figure 12A:
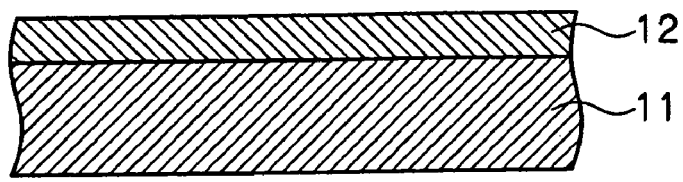
FIG. 12 includes FIGS. 12A to 12D representing steps of the resist pattern forming method utilizing an imprinting method of conventional technology.
Figure 12B:
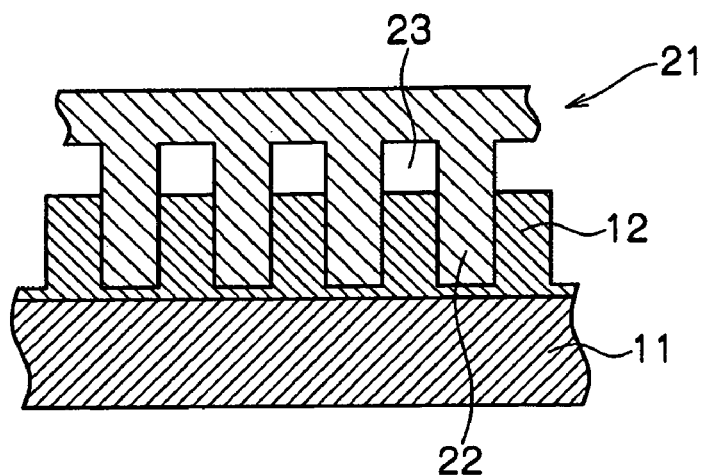
Figure 12C:
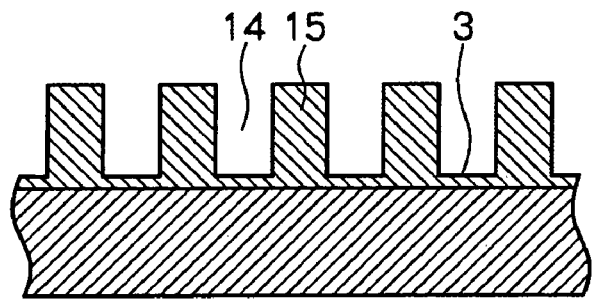
Figure 12D:
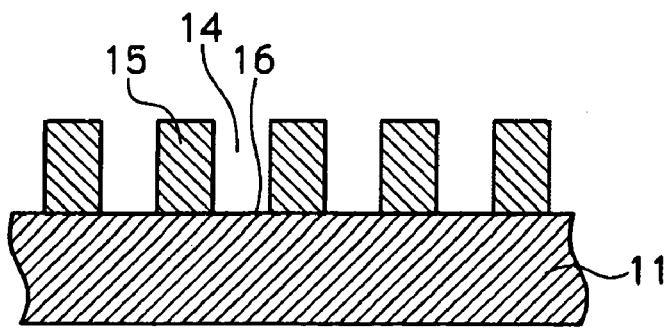
Figure 13:
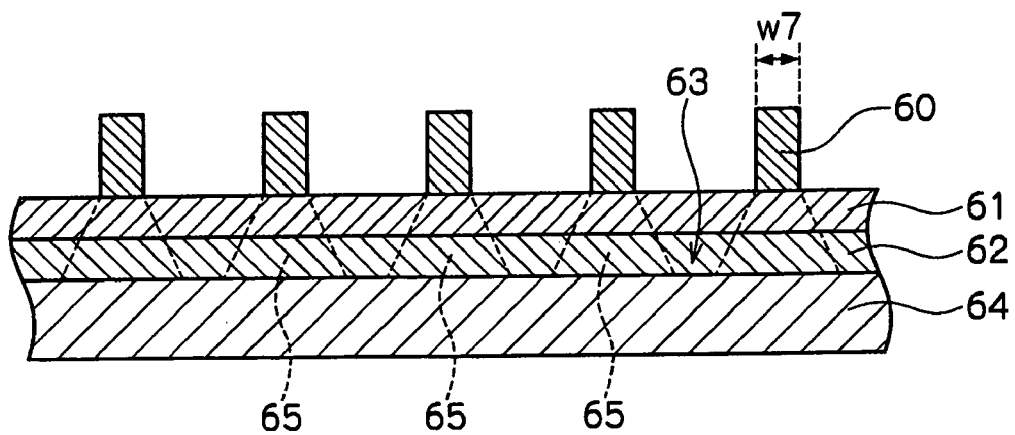
FIG. 13 is a sectional view for the explanation of a discrete track medium manufacturing method of a conventional technology.
Figure 14A:
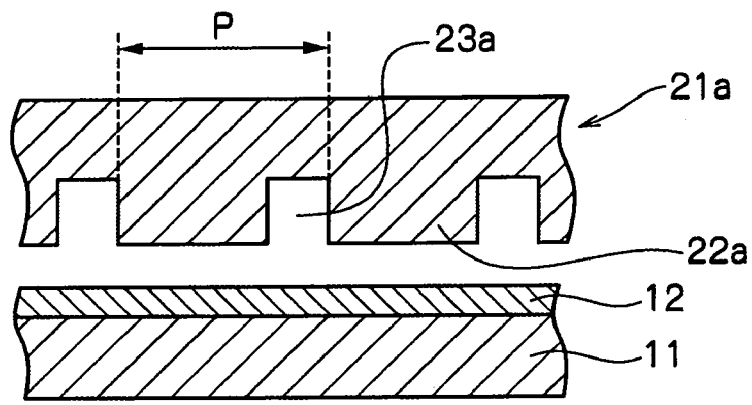
FIG. 14 includes FIGS. 14A and 14B showing sectional views of a mold used for the resist pattern forming method in the imprinting method of conventional technology.
Figure 14B:
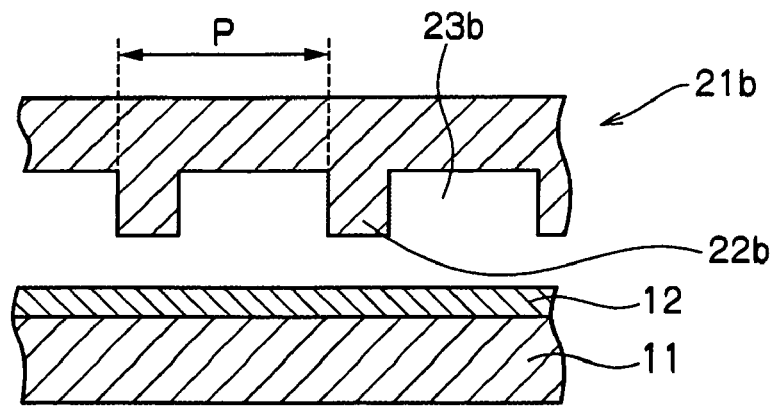

It is certified that error appears in the above-identified patent and that said Letters Patent is hereby corrected as shown below:

| Column | Line | |
|---|---|---|
| 14 | 35 | Change "FIG. 1E" to --FIG. 11E--. |

Signed and Sealed this

Twentieth Day of November, 2007

JON W. DUDAS
*Director of the United States Patent and Trademark Office*